(12) United States Patent
Alcoe et al.

(10) Patent No.: US 6,703,704 B1
(45) Date of Patent: Mar. 9, 2004

(54) STRESS REDUCING STIFFENER RING

(75) Inventors: David J. Alcoe, Vestal, NY (US); Kim J. Blackwell, Owego, NY (US); Virendra R. Jadhav, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/254,391

(22) Filed: Sep. 25, 2002

(51) Int. Cl.[7] ................... H01L 23/06; H01L 23/12
(52) U.S. Cl. .............. 257/688; 257/684; 257/693; 257/700; 257/704; 257/778; 257/691
(58) Field of Search .............................. 257/684, 693, 257/688, 700, 704, 778, 691

(56) References Cited

U.S. PATENT DOCUMENTS

| | | | |
|---|---|---|---|
| 5,838,063 A | * 11/1998 | Sylvester | ............ 257/704 |
| 5,909,056 A | * 6/1999 | Mertol | ............ 257/704 |
| 5,909,057 A | 6/1999 | McCormick et al. | |
| 5,949,137 A | * 9/1999 | Domadia et al. | ............ 257/712 |
| 6,002,171 A | 12/1999 | Desai et al. | |
| 6,018,196 A | 1/2000 | Noddin | |
| 6,051,888 A | * 4/2000 | Dahl | ............ 257/778 |
| 6,198,635 B1 | 3/2001 | Shenoy et al. | |
| 6,232,652 B1 | * 5/2001 | Matsushima | ............ 257/667 |
| 6,317,333 B1 | * 11/2001 | Baba | ............ 361/795 |
| 6,369,443 B1 | * 4/2002 | Baba | ............ 257/700 |
| 6,410,981 B2 | * 6/2002 | Tao | ............ 257/704 |
| 6,472,762 B1 | * 10/2002 | Kutfu | ............ 257/778 |
| 2001/0033017 A1 | 10/2001 | Wang et al. | |

FOREIGN PATENT DOCUMENTS

| JP | 2000349203 | 12/2000 |
|---|---|---|
| JP | 2001110926 | 4/2001 |

* cited by examiner

*Primary Examiner*—Jasmine Clark
(74) *Attorney, Agent, or Firm*—Schmeiser Olsen & Watts; William H. Steinberg

(57) ABSTRACT

An electronic structure and associated method of formation. A laminate is solderably coupled to an electronic carrier. A stiffener is adhesively attached to a portion of a surface of the laminate by a stiffener adhesive that is in physically adhesive contact with a portion of a first surface of the stiffener and with the portion of the surface of the laminate. A thermal lid is adhesively attached to a portion of a second surface of the stiffener by a lid adhesive that is in physically adhesive contact with a portion of a surface of the lid and with a portion of the second surface of the stiffener. A void region is disposed between the surface of the thermal lid and the surface of the laminate.

22 Claims, 8 Drawing Sheets

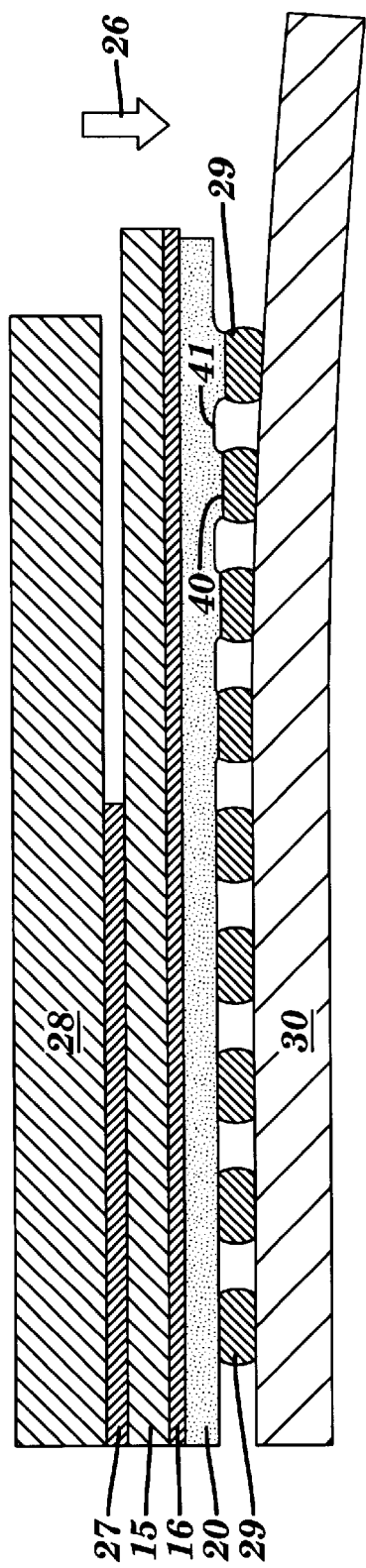
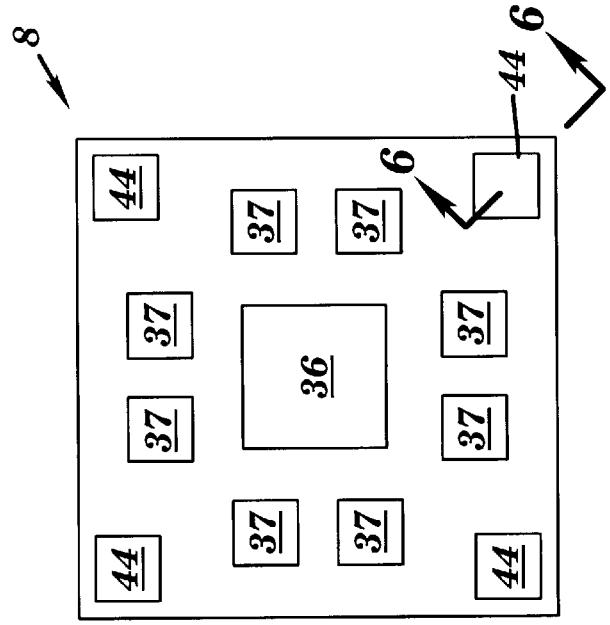
FIG. 4
FIG. 5

STRESS REDUCING STIFFENER RING

BACKGROUND OF THE INVENTION

1. Technical Field

The present invention relates to an electronic structure and associated method of formation and more particularly to a stiffener adhesively attached to a laminate that is solderably coupled to an electronic carrier, wherein the stiffener is attached to the laminate in a manner that reduces strain in the laminate when the electronic carrier is flexed.

2. Related Art

In a common configuration, a laminate (e.g., a circuitized organic laminate) may be coupled to a circuit card. The circuit card in this configuration may be flexed for a variety of reasons. Such reasons may include: circuit card handling by manufacturers during circuit card assembly, vibration or shock, forces resulting from pressure probes pushing on the circuit card, solder reflow used during soldering components (e.g., bus bars, large power converters, connectors, etc.) to the circuit card, etc. Such flexure of the circuit card may induce high stresses on materials within the laminate causing a material property to exceed a material property limit (e.g., a ductility limit or a plastic yield stress limit). This can result in high strain in the laminate materials, potentially causing damage to the laminate such as fractures and electrical fails.

Thus there is a need to reduce stresses on materials within a laminate coupled to a circuit card, wherein such stresses are induced by flexure of the circuit card.

SUMMARY OF THE INVENTION

The present invention provides an electronic structure, comprising:

a laminate solderably coupled to an electronic carrier;

a stiffener ring adhesively attached at a peripheral portion of the laminate to a surface of the laminate by a stiffener adhesive having a first surface and a second surface, wherein a portion of the first surface of the stiffener adhesive is in adhesive contact with a portion of the surface of the laminate, wherein a portion of the second surface of the stiffener adhesive is in adhesive contact with a portion of a first surface of the stiffener ring, wherein the peripheral portion is peripheral to an interior portion of the laminate that is adapted to hold at least one active electronic component, and wherein the peripheral portion of the laminate is not adapted to hold any active electronic component; and a thermal lid adhesively attached to a portion of a second surface of the stiffener ring by a lid adhesive having a first surface and a second surface, wherein a portion of the first surface of the lid adhesive is in adhesive contact with a portion of a second surface of the stiffener ring, wherein a portion of the second surface of the lid adhesive is in adhesive contact with a portion of a surface of the thermal lid, and wherein a void region is disposed between the surface of the thermal lid and the surface of the laminate.

The present invention provides a method for forming an electronic structure, comprising:

solderably coupling a laminate to an electronic carrier;

adhesively attaching a stiffener ring located at a peripheral portion of the laminate to a surface of the laminate by a stiffener adhesive having a first surface and a second surface, wherein a portion of the first surface of the stiffener adhesive is in adhesive contact with a portion of the surface of the laminate, wherein a portion of the second surface of the stiffener adhesive is in adhesive contact with a portion of a first surface of the stiffener ring, wherein the peripheral portion is peripheral to an interior portion of the laminate that is adapted to hold at least one active electronic component, and wherein the peripheral portion of the laminate is not adapted to hold any active electronic component; and adhesively attaching a thermal lid to a portion of a second surface of the stiffener ring by a lid adhesive having a first surface and a second surface, wherein a portion of the first surface of the lid adhesive is in adhesive contact with a portion of a second surface of the stiffener ring, wherein a portion of the second surface of the lid adhesive is in adhesive contact with a portion of a surface of the thermal lid, and wherein a void region is disposed between the surface of the thermal lid and the surface of the laminate.

The present invention advantageously reduce stresses on materials within a laminate coupled to a circuit card, wherein such stresses are induced by flexure of the circuit card.

BRIEF DESCRIPTION OF THE DRAWINGS

FIG. 4 depicts FIG. 3 wherein the electronic carrier is flexed, in accordance with embodiments of the present invention.

FIG. 5 depicts a modification of the plan view of the electronic structure of FIG. 2 with square stress relief openings in the stiffener ring, the stiffener adhesive, and the lid adhesive, in accordance with embodiments of the present invention.

DETAILED DESCRIPTION OF THE INVENTION

Figure 1:
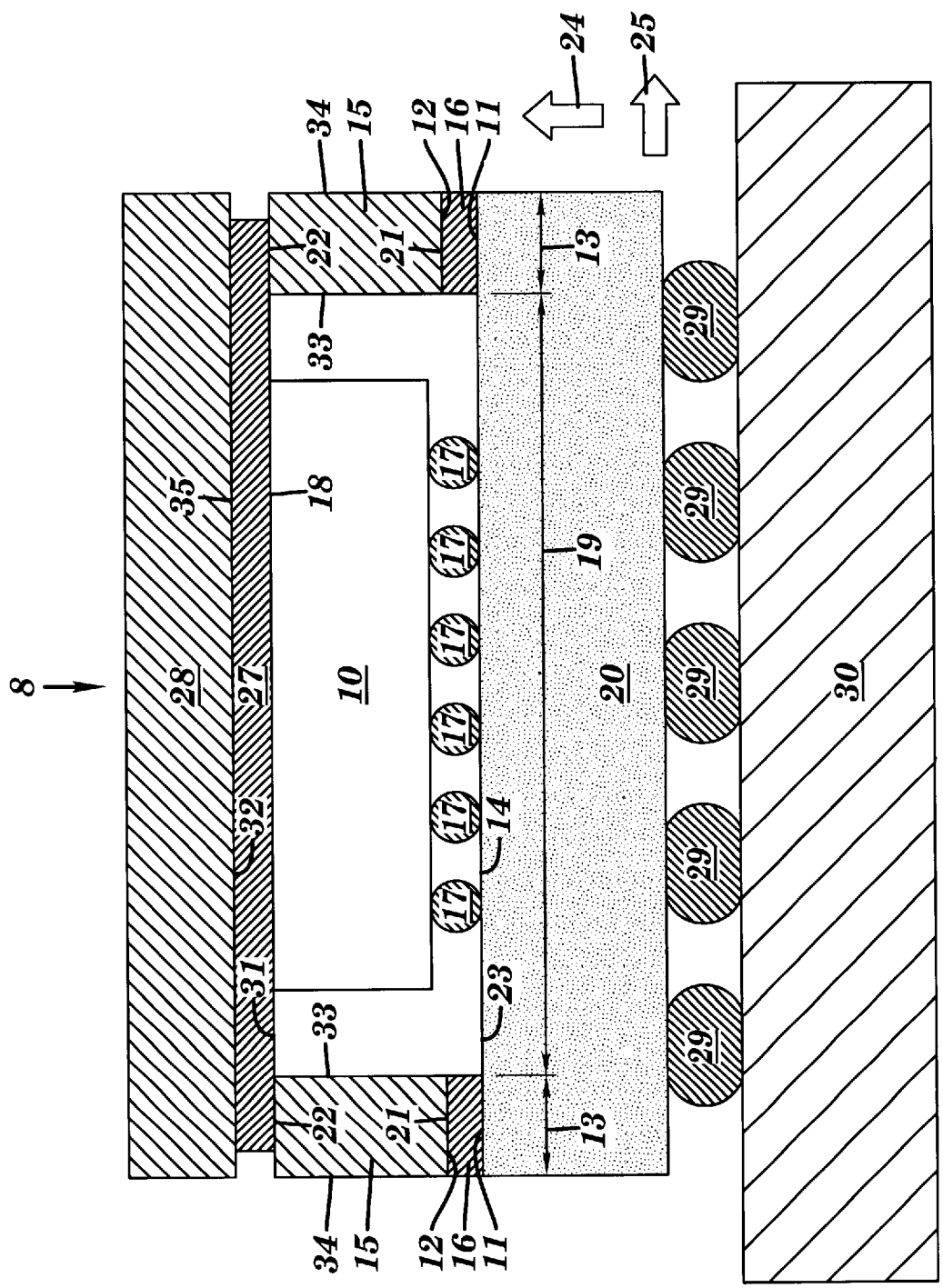
FIG. 1 depicts a cross-sectional view of an electronic structure comprising a laminate coupled to an electronic carrier, a stiffener ring adhesively coupled to the laminate by a stiffener adhesive, and a thermal lid adhesively coupled to the stiffener ring by a lid adhesive, in accordance with embodiments of the present invention.

FIG. 1 depicts a cross-sectional view of an electronic structure 8, in accordance with embodiments of the present invention. The electronic structure 8 comprises an electronic carrier 30, a laminate 20 solderably coupled to the electronic carrier 30 by solder members 29, a semiconductor chip 10 solderably coupled to the laminate 20 by solder members 17, a stiffener ring 15 adhesively attached at a peripheral portion 13 of the laminate 20 by a stiffener adhesive 16, and a thermal lid 28 adhesively attached by a lid adhesive 27 to the stiffener ring 15 and to a surface 18 of the semiconductor chip 10.

A portion of a first surface 11 of the stiffener adhesive 16 is in adhesive contact with a portion of the surface 23 of the laminate 20, and a portion of a second surface 12 of the stiffener adhesive 16 is in adhesive contact with a portion of a first surface 21 of the stiffener ring 15. A portion of a second surface 22 of the stiffener ring is in adhesive contact with a portion of a first surface 31 of the lid adhesive 27, and a portion of a second surface 32 of the lid adhesive 27 is in adhesive contact with a portion of a surface 35 of the thermal lid 28.

The electronic carrier 30 may comprise, inter alia, a circuit card. The solder members 29 may comprise, inter alia, ball grid array (BGA) solder balls. The laminate 20 may comprise, inter alia, a chip carrier (e.g., an organic chip carrier). The laminate 20 may have a thickness (in the direction 24) of, inter alia, 2 to 50 mils. The laminate 20 may have a lateral dimension (in the direction 25) of, inter alia, 20 to 53 mm. The solder members 17 may comprise, inter alia, controlled collapse chip connection (C4) solder balls.

The stiffener ring 15 has a functionality of keeping the laminate 20 flat, particularly when used with a flexible laminate such as an organic chip carrier, and thus comprises a mechanically stiff material. The stiffener ring 15 has an innermost perimeter boundary 33 and an outermost perimeter boundary 34. The stiffener ring 15 may comprise a metallic substance such as, inter alia, stainless steel, copper, etc. The stiffener ring 15 may have a thickness (in the direction 24) of, inter alia, 10 to 40 mils.

The peripheral portion 13 of the laminate 20 to which the stiffener ring 15 is adhesively attached is peripheral to an interior portion 19 of the laminate 20. The interior portion 19 of the laminate 20 is adapted to hold at least one active electronic component (e.g., the semiconductor chip 10). The peripheral portion 13 of the laminate 20 is not adapted to hold any active electronic component but may hold a passive electrical device such as a capacitor or resistor.

The stiffener adhesive 16 may be electrically insulative in order to protect against electrical shorting of electrically conductive features on the surface 14 of the laminate 20. The stiffener adhesive 16 may be thermally conductive to facilitate heat dissipation. The stiffener adhesive 16 may comprise, inter alia, PYRALUX® which is a polyimide carrier. The stiffener adhesive 16 may have a thickness (in the direction 24) of, inter alia, 5 mils ±1 mil.

The thermal lid 28 has a heat spreading function in support of dissipating heat generated by the semiconductor chip 10. The thermal lid 28 may comprise, inter alia, copper, aluminum, a silicon carbide alloy, etc. The thermal lid 28 may have a thickness (in the direction 24) of, inter alia, 10 to 50 mils.

The lid adhesive 27 may be electrically conductive or electrically insulative. The lid adhesive 27 may be thermally conductive to facilitate heat dissipation. The lid adhesive 27 may comprise, inter alia, a heat-cured silicone epoxy material having a filler such as an aluminum filler. The lid adhesive 27 may have a thickness (in the direction 24) of, inter alia, 1 to 10 mils.

Figure 2:
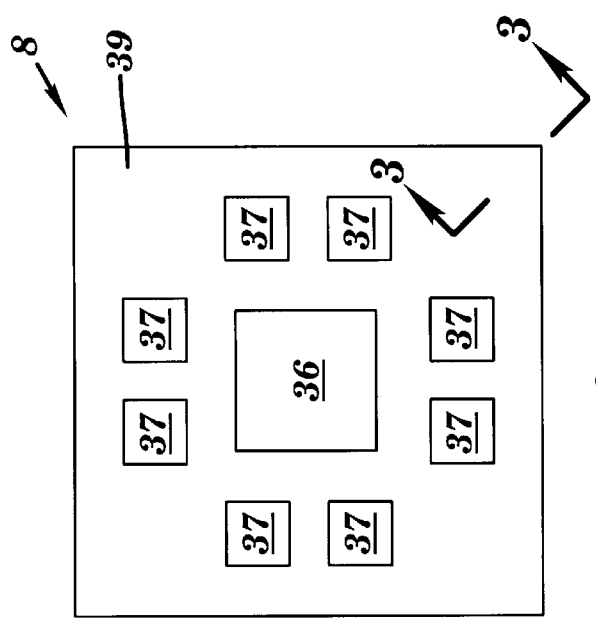
FIG. 2 depicts a simplified plan view of the electronic structure of FIG. 1, in accordance with embodiments of the present invention.

FIG. 2 depicts a simplified plan view of the electronic structure 8 of FIG. 1, in accordance with embodiments of the present invention. The central opening 36, which is a window to the interior portion 19 of the laminate 20 shown in FIG. 1, is surrounded by a peripheral ring 39 which projects onto the peripheral portion 13 of the laminate 20 shown in FIG. 1. As was shown supra in conjunction with FIG. 1, the semiconductor chip 10 is located on the interior portion 19 of the laminate 20, and the stiffener ring 15 is located on the peripheral portion 13 of the laminate 20. The peripheral openings 37 in FIG. 2 project to regions which may include passive devices such as capacitors.

Figure 3:
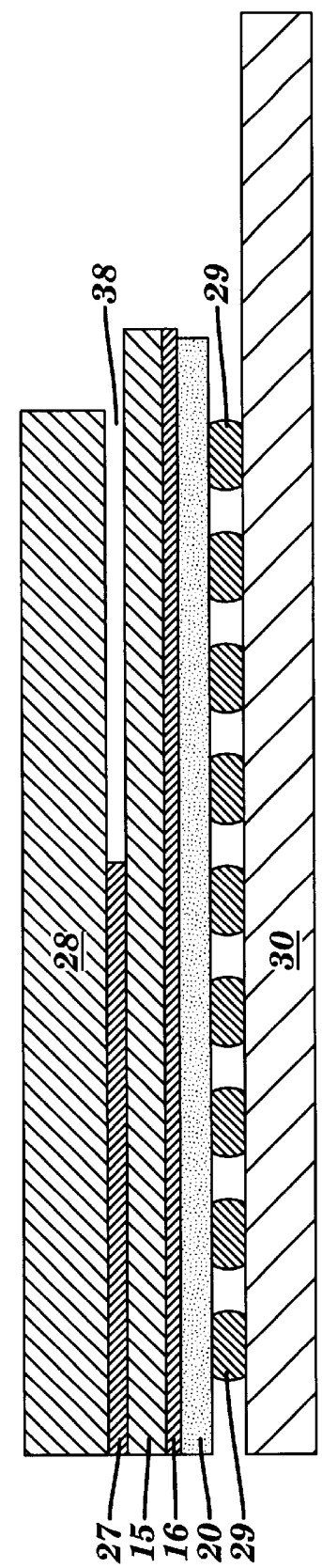
FIG. 3 depicts a cross-sectional view taken along line 3—3 of FIG. 2, showing a corner portion of the electronic structure of FIG. 2, in accordance with embodiments of the present invention.

FIG. 3 depicts a cross-sectional view taken along line 3—3 of FIG. 2, showing a corner portion of the electronic structure 8 of FIG. 2, in accordance with embodiments of the present invention. The corner portion shown in FIG. 3 is wholly contained in a space within, below, and above the peripheral portion 13 of the laminate 20 of FIG. 1. In FIG. 3, the laminate 20 is solderably coupled to the electronic carrier 30 by solder members 29, the stiffener ring 15 is adhesively attached to the laminate 20 by the stiffener adhesive 16, and the thermal lid 28 is adhesively attached by the lid adhesive 27 to the stiffener ring 15. The space 38 between the thermal lid 28 and the stiffener ring 15 partially decouples the thermal lid 28 from the stiffener ring 15 so that any flexing of thermal lid 28 will not force the laminate 20 to responsively bend very much.

FIG. 4 depicts FIG. 3 wherein the electronic carrier 30 flexed away from the laminate 20 in the direction 26, in accordance with embodiments of the present invention. If the stiffener ring 15 and solder members 29 are significantly more rigid than the laminate 20, then the flexing of the electronic carrier 30 in the direction 26 will cause the laminate 20 to maximally stretch in the direction 26 at locations 40 where the laminate 20 interfaces with the solder members 29. However, the laminate 20 will minimally stretch in the direction 26 at locations 41 at a midpoint location between two adjacent solder members 29. As a result of the aforementioned distortion of the laminate 20 due to said differential stretching of the laminate 20, stresses on the laminate 20 will develop near the edge of the solder members 29, which can lead to cracking of the laminate 20 and also solder members 29.

The present invention discloses creation of void regions and gaps within the stiffener 15, the stiffener adhesive 16, or both, as described infra in conjunction with FIGS. 5–14. Such void regions and gaps permit the laminate 20 to flex (in response to flexure of the electronic carrier 30) with no distortion, or with less distortion than if such void regions and gaps were absent.

FIG. 5 depicts a modification of the plan view of the electronic structure 8 of FIG. 2 with a square stress relief openings 44 in the stiffener ring 15, the stiffener adhesive 16, and the lid adhesive 27, in accordance with embodiments of the present invention.

Figure 6:
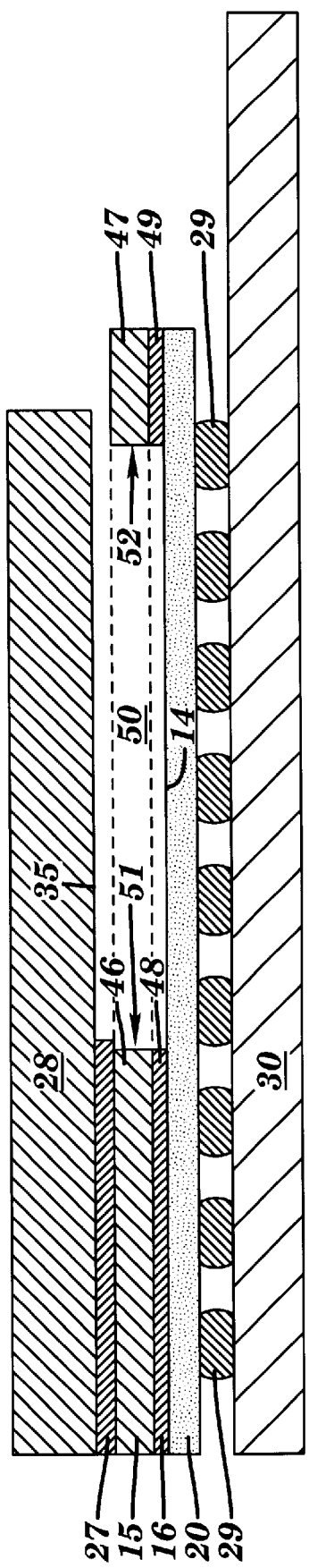
FIG. 6 depicts a cross-sectional view taken along line 6—6 of FIG. 5, showing a corner portion of the electronic structure of FIG. 5, in accordance with embodiments of the present invention.

FIG. 6 depicts a cross-sectional view taken along line 6—6 of FIG. 5, showing a corner portion of the electronic structure 8 of FIG. 5, in accordance with embodiments of the present invention. The corner portion shown in FIG. 6 is wholly contained in a space within, below, and above the peripheral portion 13 of the laminate 20 of FIG. 1. In FIG. 6, the laminate 20 is solderably coupled to the electronic carrier 30 by solder members 29, the stiffener ring 15 is adhesively attached to the laminate 20 by the stiffener adhesive 16, and the thermal lid 28 is adhesively attached by the lid adhesive 27 to the stiffener ring 15.

In FIG. 6, a void region 50 within the square stress relief opening 44 of FIG. 5 is disposed between the surface 35 of the thermal lid 28 and the surface 14 of the laminate 20. In particular, the void region 50 is a gap that extends from the surface 35 of the thermal lid 28 to the surface 14 of the laminate 20. The gap 50 comprises an inner end 51 and an outer end 52. The inner end 51 of the gap 50 is bounded by an inner portion 46 of the stiffener ring 15, an inner portion 48 of the stiffener adhesive 16, and the lid adhesive 27. The outer end 52 of the gap 50 is bounded by an outer portion 47 of the stiffener ring 15 and by an outer portion 49 of the stiffener adhesive 16. The outer end 52 of the gap 50 is not bounded by the lid adhesive 27.

Figure 7:
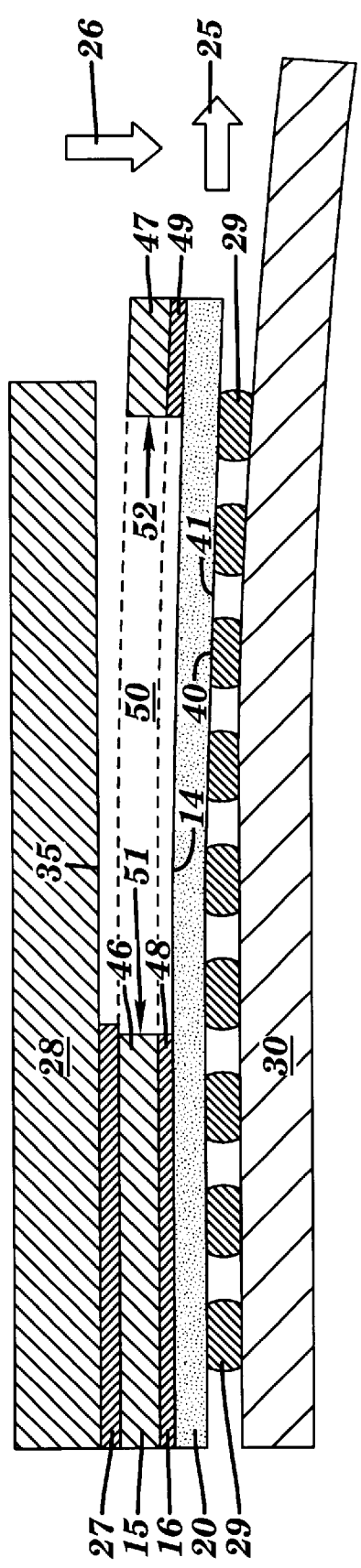
FIG. 7 depicts FIG. 6 wherein the electronic carrier is flexed, in accordance with embodiments of the present invention.

FIG. 7 depicts FIG. 6 wherein the electronic carrier 30 is flexed, in accordance with embodiments of the present invention. In contrast with FIG. 4, the laminate 20 in FIG. 7 does not differentially stretch in the direction 26 between the locations 40 where the laminate 20 interfaces with the solder members 29 and locations 41 at a midpoint location between two adjacent solder members 29. Consequently, stresses on the laminate 20 and solder members 29 will not develop near the edge of the solder members 29 as it does in FIG. 4. Thus, the gap 50 permits the laminate 20 to flex (in response to flexure of the electronic carrier 30) with no distortion, or with less distortion than if the gap 50 were absent. Yet as is shown in FIG. 7, the remaining inner portion 46 and the outer portion 47 of the stiffener ring 15 are sufficient to keep the laminate 20 approximately flat (in absence of flexure of the electronic carrier 30).

As an alternative configuration, the outer portions 47 and 49 of the stiffener ring 15 and the stiffener adhesive 16, respectively, in FIG. 7 may be eliminated, which would permit the laminate 20 to more freely flex with yet less constraint. Although this alternative would diminish the ability of the stiffener ring 15 to keep the laminate 20 perfectly flat, the laminate 20 can nonetheless be kept acceptably flat if the lateral extent of the gap 50 (i.e., in the direction 25) is sufficiently short (e.g., a length of 3 or 4 sequentially ordered solder members 29) depending on the material properties (e.g., modulus or stiffness) and the maximum acceptable deviation from planarity (i.e., flatness) of the laminate 20. This alternative configuration is essentially the same as the configuration shown in FIG. 7 except that in this alternative configuration the outer end 52 of the gap 50 is not bounded by the stiffener ring 15 and the stiffener adhesive 16.

Figure 9:
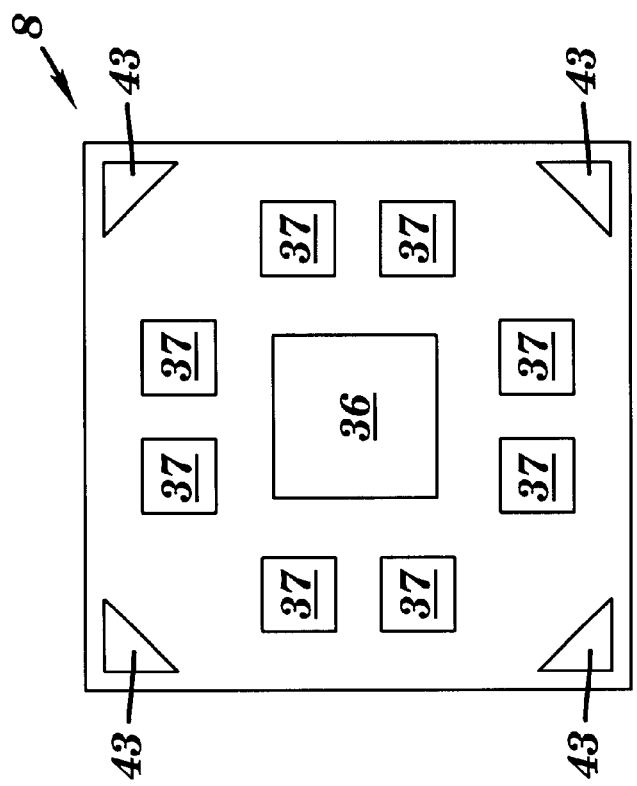
FIG. 9 depicts FIG. 5 with the square stress relief openings being replaced by triangular stress relief openings, in accordance with embodiments of the present invention.
Figure 8:
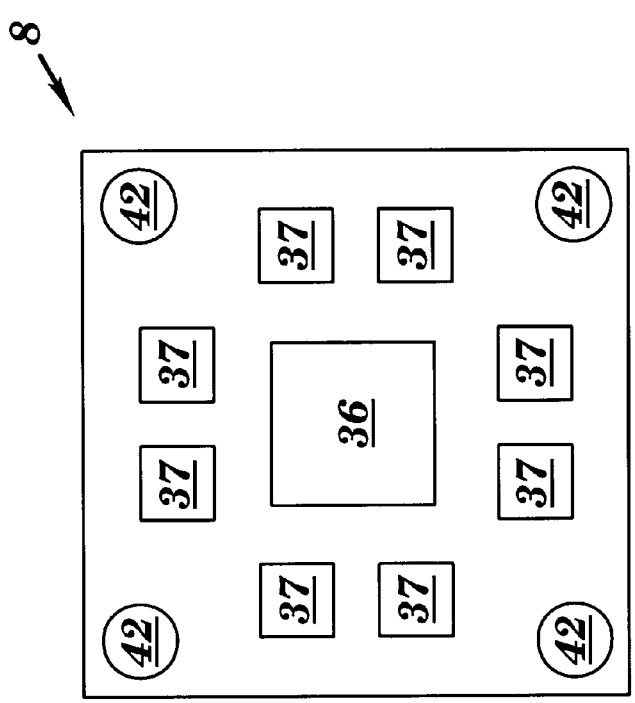
FIG. 8 depicts FIG. 5 with the square stress relief openings being replaced by circular stress relief openings, in accordance with embodiments of the present invention.

FIG. 8 depicts FIG. 5 with the square stress relief openings 44 being replaced by circular stress relief openings 42, in accordance with embodiments of the present invention. FIG. 9 depicts FIG. 5 with the square stress relief openings 44 being replaced by triangular stress relief openings 43, in accordance with embodiments of the present invention. Generally, the openings 44, 42, 43, etc. (and corresponding void region or gap 50) may have any geometrical shape (square, rectangular, circular, elliptical, triangular, an n-sided polygon such that n is any positive integer of at least 3, etc.).

Figure 10:
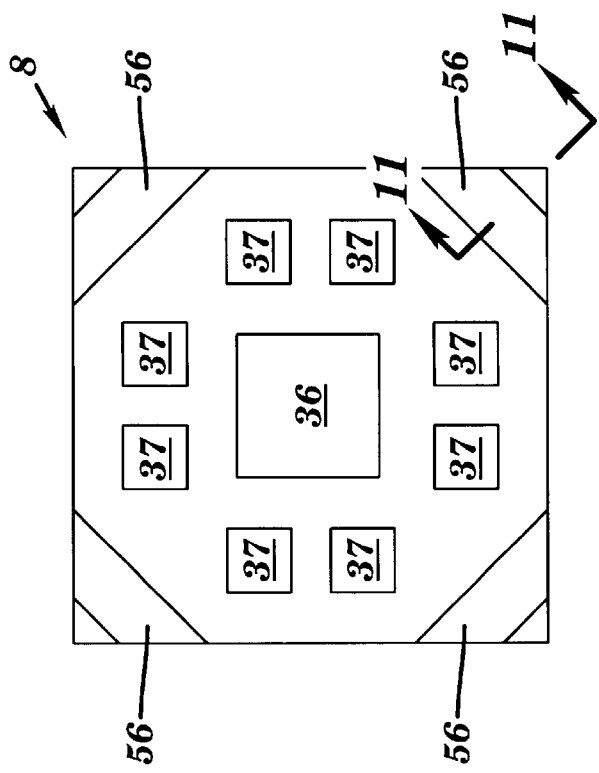
FIG. 10 depicts FIG. 5 with the square stress relief openings being replaced by oriented slots, in accordance with embodiments of the present invention.

FIG. 10 depicts the plan view of the electronic structure 8 of FIG. 5 with the square stress relief openings 44 being replaced by oriented slots 56, in accordance with embodiments of the present invention.

Figure 11:
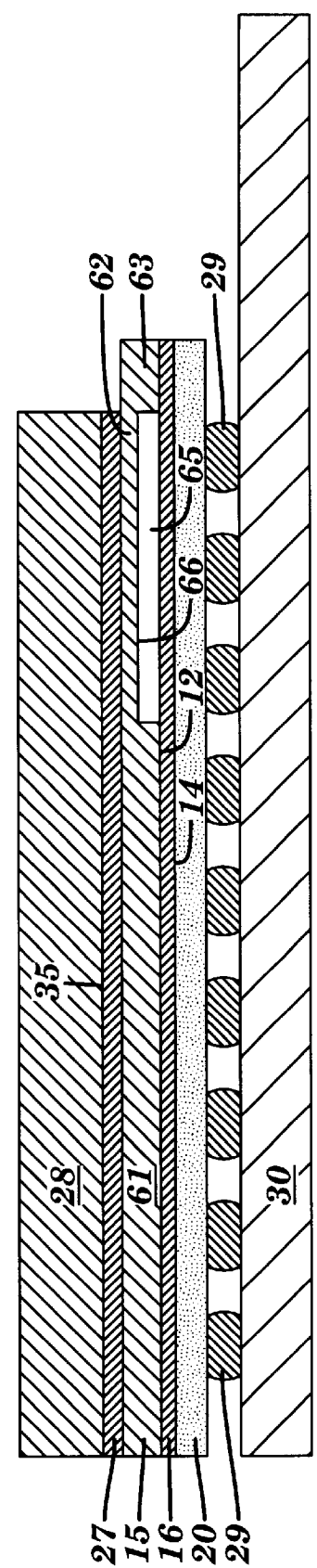
FIG. 11 depicts a cross-sectional view taken along line 11—11 of FIG. 10, showing a corner portion of the electronic structure of FIG. 10, in accordance with embodiments of the present invention.

FIG. 11 depicts a cross-sectional view taken along line 11—11 of FIG. 10, showing a corner portion of the electronic structure 8 of FIG. 10, in accordance with embodiments of the present invention. The corner portion shown in FIG. 11 is wholly contained in a space within, below, and above the peripheral portion 13 of the laminate 20 of FIG. 1. In FIG. 11, the stiffener ring 15 comprises relatively thick portions 61 and 63 and a relatively thin portion 62 that interfaces between (and is in continuous contact with) the relatively thick portions 61 and 63. The stiffener ring 15 also comprises a void region or gap 65 that extends from a surface 66 of the relatively thin portion 62 of the stiffener ring 15 to the second surface 12 of the stiffener adhesive 16. The void region or gap 65 also extends from the relatively thick portion 61 to the relatively thick portion 63 of the stiffener ring 15. The void region or gap 65, being completely enclosed, may be viewed as a "closed gap".

Although the gap 65 in FIG. 11 somewhat constrains the laminate 20 from freely moving with little or no distortion in response to flexing of the electronic carrier 30 (particularly in contrast with the void region 50 of FIG. 6), the gap 65 nonetheless causes the laminate 20 in FIG. 11 to be less constrained than is the laminate 20 in FIG. 3 where there is no gap in the stiffener ring 15. In contrast with FIG. 6, the presence of the stiffener adhesive 16 between the gap 65 and the laminate 20 advantageously protects the laminate 20 from contamination by particles of the lid adhesive 27 should the lid adhesive 27 fracture or migrate or otherwise release such lid adhesive particles. Also in contrast with FIG. 6, the presence of the stiffener adhesive 16 between the gap 65 and the laminate 20 in FIG. 11 also advantageously avoids the additional processing time for removing the portion of the stiffener adhesive 16 that exists between the gap 65 and the laminate 20. Nonetheless, the scope of the present invention also includes elimination of some or all of the stiffener adhesive 16 between the gap 65 and the laminate 20, since such elimination preserves the advantage of having the laminate 20 in FIG. 11 less constrained than is the laminate 20 in FIG. 3.

Figure 12:
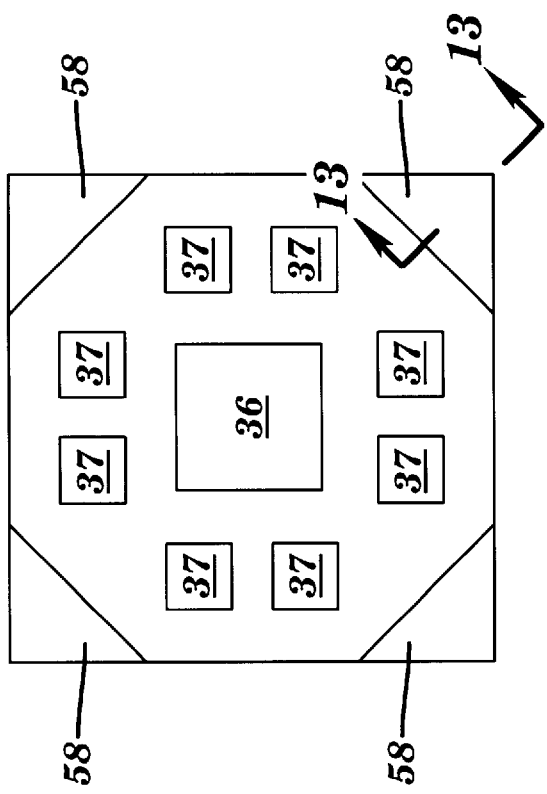
FIG. 12 depicts FIG. 5 with the square stress relief openings being replaced by oriented slots, in accordance with embodiments of the present invention.

FIG. 12 depicts the plan view of the electronic structure 8 of FIG. 5 with the square stress relief openings 44 being replaced by oriented slots 58, in accordance with embodiments of the present invention.

Figure 13:
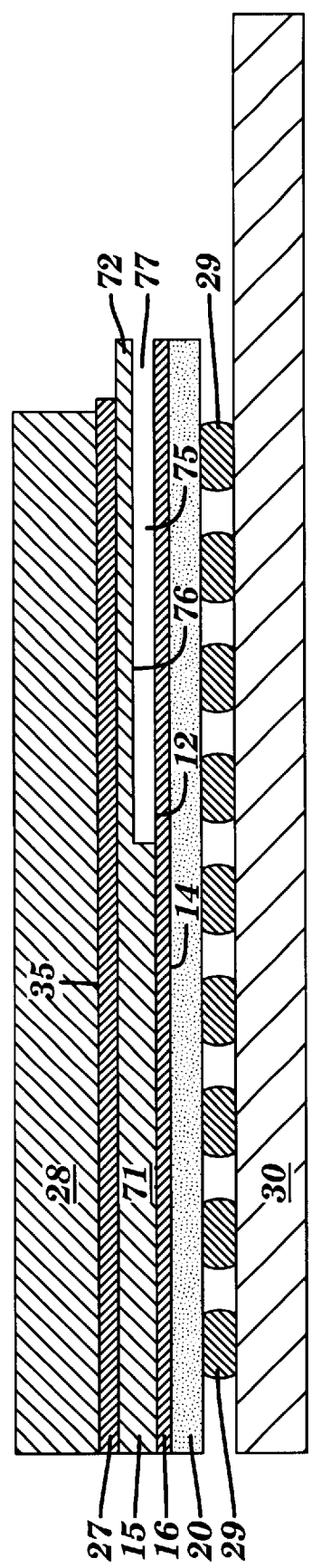
FIG. 13 depicts a cross-sectional view taken along line 13—13 of FIG. 12, showing of a coener portion of the electronic structure of FIG. 12, in accordance with embodiments of the present invention.

FIG. 13 depicts a cross-sectional view taken along line 13—13 of FIG. 12, showing a corner portion of the electronic structure 8 of FIG. 10, in accordance with embodiments of the present invention. The corner portion shown in FIG. 13 is wholly contained in a space within, below and above the peripheral portion 13 of the laminate 20 of FIG. 1. In FIG. 13, the stiffener ring 15 comprises a relatively thick portion 71 and an outermost relatively thin portion 72.

The stiffener ring 15 also comprises a void region or gap 75 that extends from a surface 76 of the relatively thin portion 72 of the stiffener ring 15 to the second surface 12 of the stiffener adhesive 16. The void region or gap 75 also extends from the relatively thick portion 71 outward toward an open end 77 of the void region or gap 75. Since the void region or gap 65 is bounded by the open end 77, the void region or gap 75 may be viewed as an "open gap".

The gap 75 in FIG. 13, being an open gap, advantageously provides less constraints on free movement of the laminate 20 in response to flexing of the electronic carrier 30 than does the closed gap 65 of FIG. 11. The open gap 75 of FIG. 13 also has the advantages described supra for the closed gap 65 of FIG. 11, namely protection of the laminate 20 from contamination by particles of the lid adhesive 27 and avoiding the additional processing time for removing the portion of the stiffener adhesive 16 that exists between the gap 65 and the laminate 20. However, the stiffener ring 15 of FIG. 13 will be less effective than the stiffener ring 15 of FIG. 11 in keeping the laminate 20 flat because of the presence of the portion 63 in the stiffener ring 15 in FIG. 11 and absence of a corresponding stiffener ring portion in FIG. 13. The scope of the present invention also includes elimination of some or all of the stiffener adhesive 16 between the gap 75 and the laminate 20, since such elimination preserves the advantage of having the laminate 20 in FIG. 13 less constrained than is the laminate 20 in FIG. 3.

Figure 14:
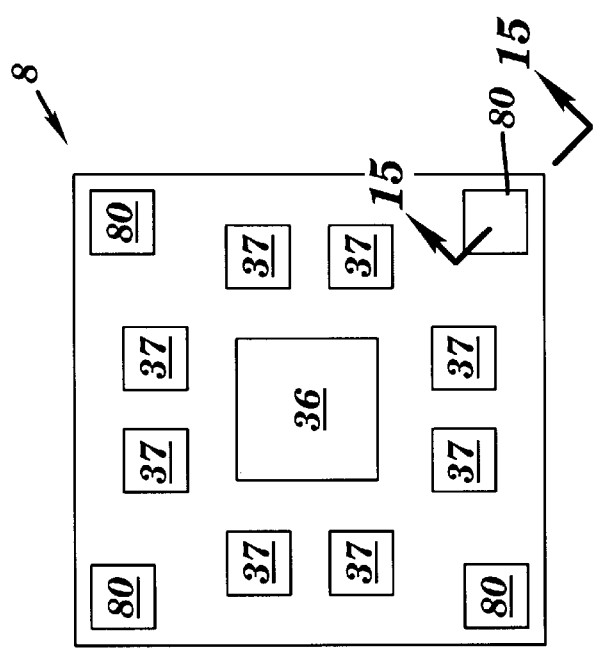
FIG. 14 depicts a modification of the plan view of the electronic structure of FIG. 2 with the square stress relief openings of FIG. 5 being replaced by corresponding square stress relief openings in FIG. 14, in accordance with embodiments of the present invention.

FIG. 14 depicts a modification of the plan view of the electronic structure 8 of FIG. 5 with the stress release openings 44 of FIG. 5 being replaced by corresponding square stress relief openings 80 in FIG. 14, in accordance with embodiments of the present invention.

Figure 15:
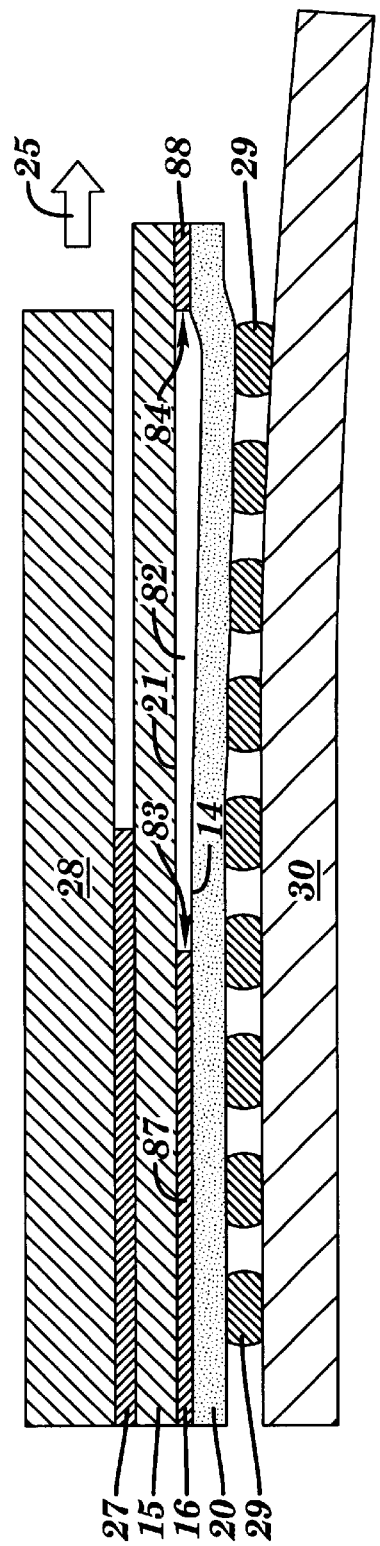
FIG. 15 depicts a cross-sectional view taken along line 15—15 of FIG. 14, showing a corner portion of the electronic structure of FIG. 14 such that the electronic carrier is flexed, in accordance with embodiments of the present invention.

FIG. 15 depicts a cross-sectional view taken along line 15—15 of FIG. 14, showing a corner portion of the electronic structure 8 of FIG. 14 such that the electronic carrier 30 is flexed, in accordance with embodiments of the present invention. In FIG. 15, a void region 82 within the square stress relief opening 80 of FIG. 14 is disposed between the surface 21 of the stiffener ring 15 and the surface 14 of the laminate 20. In particular, the void region 82 is a gap that extends from the surface 21 of the stiffener ring 15 to the surface 14 of the laminate 20. The gap 82 comprises an inner end 83 and an outer end 84. The inner end 83 of the gap 82 is bounded by an inner portion 87 of the stiffener adhesive 16. The outer end 84 of the gap 82 is bounded by an outer portion 88 of the stiffener adhesive 16. The void region or gap 80, being completely enclosed, is a closed gap.

A feature of FIG. 15 is that the gap 80 exists only in the stiffener adhesive 16 and not in the stiffener ring 15. Although FIG. 15 shows a single gap 80 in the stiffener adhesive 16, there may exist a plurality of such gaps 80 in the stiffener adhesive 16 such as gaps punched as openings in the stiffener adhesive 16 sheet formed prior to assembly of the electronic structure 8. The gap 80 decouples the stiffener ring 15 from the laminate 20 everywhere across the length of the gap 80 (i.e., in the direction 25) except near the outside corner (i.e., near the outer portion 88 of the stiffener adhesive 16). While the gap 80 permits the laminate 20 to somewhat freely bend in respond to flexure of the electronic carrier 30, such bending of the laminate 20 bends severely near the outside corner (i.e., near the outer portion 88 of the stiffener adhesive 16) due to adhesive attachment of the stiffener ring 15 to the laminate 20 at the outside corner. Although this outside corner effect is undesirable, the embodiment of FIG. 15 still permits more free bending of the laminate 20 than in the configuration of FIG. 4. The outside corner effect is mitigated by the fact that most circuitry within the electronic structure 8 is located near the semiconductor chip 10 (see FIG. 1) and not near the outside corner. Therefore, even if the laminate 20 cracks at the outside corner, such localized cracking is unlikely to cause damage to circuitry within the electronic structure 8, and reduced laminate 20 constraint will contribute to reduced stresses on solder members 29.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. An electronic structure, comprising:
   a laminate solderably coupled to an electronic carrier;
   a stiffener ring adhesively attached at a peripheral portion of the laminate to a surface of the laminate by a stiffener adhesive having a first surface and a second surface, wherein a portion of the first surface of the stiffener adhesive is in adhesive contact with a portion of the surface of the laminate, wherein a portion of the second surface of the stiffener adhesive is in adhesive contact with a portion of a first surface of the stiffener ring, wherein the peripheral portion is peripheral to an interior portion of the laminate that is adapted to hold at least one active electronic component, and wherein the peripheral portion of the laminate is not adapted to hold any active electronic component; and
   a thermal lid adhesively attached to a portion of a second surface of the stiffener ring by a lid adhesive having a first surface and a second surface, wherein a portion of the first surface of the lid adhesive is in adhesive contact with a portion of a second surface of the stiffener ring, wherein a portion of the second surface or the lid adhesive is in adhesive contact with a portion of surface of the thermal lid, wherein a void region is disposed between the surface of the thermal lid and the surface of the laminate, and wherein the void region does not continuously extend from the surface of the thermal lid and to the surface of the laminate.

2. The electronic structure of claim 1, wherein the void region comprises a gap that extend from the surface of the thermal lid to the second surface of the stiffener ring, and wherein no portion of the gap is disposed between the second surface of the stiffener ring and the surface of the laminate.

3. The electronic structure of claim 1, wherein the void region comprises a closed gap that extends from the first surface of the stiffener ring to the surface of the laminate, wherein the gap comprises an inner end and an outer end, wherein the inner end is bounded by an inner portion of the stiffener adhesive, and wherein the outer end is bounded by an outer portion of the stiffener adhesive.

4. The electronic structure of claim 1, further comprising a semiconductor chip coupled to the laminate, wherein the thermal lid is in adhesive contact with the semiconductor chip, wherein the laminate comprises a chip carrier, and wherein the electronic carrier comprises a circuit card.

5. An electronic structure, comprising:
   a laminate solderably coupled to an electronic carrier;
   a stiffener ring adhesively attached at a peripheral portion of the laminate to a surface of the laminate by a stiffener adhesive having a first surface and a second surface, wherein a portion of the first surface of the stiffener adhesive is in adhesive contact with a portion of the surface of the laminate, wherein a portion of the second surface of the stiffener adhesive is in adhesive contact with a portion of a first surface of the stiffener ring, wherein the peripheral portion is peripheral to an interior portion of the laminate that is adapted to hold at least one active electronic component, and wherein the peripheral portion of the laminate is not adapted to hold any active electronic component; and a thermal lid adhesively attached to a portion of a second surface of the stiffener ring by a lid adhesive having a first surface and a second surface, wherein a portion of the first surface of the lid adhesive is in adhesive contact with a portion of a second surface of the stiffener ring, wherein a portion of the second surface of the lid adhesive is in adhesive contact with a portion of a surface of the thermal lid, wherein the void region comprises a gap that extends from the surface of the thermal lid to the surface of the laminate, wherein the gap comprises an inner end and an outer end, wherein the inner end is bounded by an inner portion of the stiffener ring, an inner portion of the stiffener adhesive, and the lid adhesive, wherein the outer end is bounded by an outer portion of the stiffener ring and by in outer portion of the stiffener adhesive, and wherein the outer end is not bounded by the lid adhesive.

6. The electronic structure of claim 5, further comprising a semiconductor clip coupled to the laminate, wherein the thermal lid is in adhesive contact with the semiconductor chip, wherein the laminate comprises a chip carrier, and wherein the electronic carrier comprises a circuit card.

7. An electronic structure, comprising:

a laminate solderably coupled to an electronic carrier;

a stiffener ring adhesively attached at a peripheral portion of the laminate to a surface of the laminate by a stiffener adhesive having a first surface and a second surface, wherein a portion of the first surface of the stiffener adhesive is in adhesive contact with a portion of the surface of the laminate, wherein a portion of the second surface of the stiffener adhesive is in adhesive contact with a portion of a first surface of the stiffener ring, wherein the peripheral portion is peripheral to an interior portion of the laminate that is adapted to hold at least one active electronic component, and wherein the peripheral portion of the laminate is not adapted to hold any active electronic component; and a thermal lid adhesively attached to a portion of a second of the stiffener ring by a lid adhesive having a first surface and a second surface, wherein a portion of the first surface of the lid adhesive is in adhesive contact with a portion of a second surface of the stiffener ring, wherein a portion of the second surface of the lid adhesive is in adhesive contact with a portion of a surface of the thermal lid, and wherein a void region is disposed between the surface of the thermal lid and the surface of the laminate, wherein the void region comprises a gap that extends from the surface of the thermal lid to the surface of the laminate, wherein the gap comprises an inner end and an outer end, wherein the inner end is bounded by an inner portion of the stiffener ring, an inner portion of the stiffener adhesive, and an inner portion of the lid adhesive, wherein the outer end is not bounded by any of the stiffener ring, the stiffener adhesive, and the lid adhesive.

8. The electronic structure of claim 7, further comprising a semiconductor chip coupled to the laminate, wherein the thermal lid is in adhesive contact with the semiconductor chip, wherein the laminate comprises a chip carrier, and wherein the electronic carrier comprises a circuit card.

9. An electronic structure, comprising:

a laminate solderably coupled to an electronic carrier;

a stiffener ring adhesively attached at a peripheral portion of the laminate to a surface of the laminate by a stiffener adhesive having a first surface and a second surface, wherein a portion of the first surface of the stiffener adhesive is in adhesive contact with a portion of the surface of the laminate, wherein a portion of the second surface of the stiffener adhesive is in adhesive contact with a portion of a first surface of the stiffener ring, wherein the peripheral portion is peripheral to an interior portion of the laminate that is adapted to hold at least one active electronic component, and wherein the peripheral portion of the laminate is not adapted to hold any electronic component; and a thermal lid adhesively attached to a portion of a second surface of the stiffener ring by a lid adhesive having a first surface and a second surface, wherein a portion of the first surface of the lid adhesive is in adhesive contact with a portion of a second surface of the stiffener ring, wherein a portion of the second surface of the lid adhesive is in adhesive contact with a portion of a surface of the thermal lid, and wherein a void region is disposed between the surface of the thermal lid and the surface of the laminate, wherein the stiffener ring comprises a first portion and a second portion that is thinner than the first portion, wherein the void region is disposed between a surface of the second portion of the stiffener ring and the surface of the laminate.

10. The electronic structure of claim 9, wherein the void region comprises a gap that extends from the surface of the second portion of the stiffener ring to the second surface of the stiffener adhesive.

11. The electronic structure of claim 10, wherein the gap is a closed gap.

12. The electronic structure of claim 10, wherein the gap is an open gap.

13. The electronic structure of claim 9, further comprising a semiconductor chip coupled to the laminate, wherein the thermal lid is in adhesive contact with the semiconductor chip, wherein the laminate comprises a chip carrier, and wherein the electronic carrier comprises a circuit card.

14. A method for forming an electronic structure, comprising:

solderably coupling a laminate to an electronic carrier;

adhesively attaching a stiffener ring located at a peripheral portion of the laminate to a surface of the laminate by a stiffener adhesive having a first surface and a second surface, wherein a portion of the first surface of the stiffener adhesive is in adhesive contact with a portion of the surface of the laminate, wherein a portion of the second surface of the stiffener adhesive is in adhesive contact with a portion of a first surface of the stiffener ring, wherein the peripheral portion is peripheral to an interior portion of the laminate that is adapted to hold at least one active electronic component, and wherein the peripheral portion of the laminate is not adapted to hold any active electronic component; and adhesively attaching a thermal lid to a portion of a second surface of the stiffener ring by a lid adhesive having a first surface and a second surface, wherein a portion or the first surface of the lid adhesive is in adhesive contact with a portion of a second surface of the stiffener ring, wherein a portion of the second surface of the lid adhesive is in adhesive contact with a portion of a surface of the thermal lid, and wherein a void region is disposed between the surface of the thermal lid and the surface of the laminate, and wherein the void region does not continuously extend from the surface of the thermal lid and to the surface of the laminate.

15. The method of claim 14, wherein the void region comprises a gap that extends front the surface of the thermal lid to the second surface of the stiffener ring, and wherein no portion of the gap is disposed between the second surface of the stiffener ring and the surface of the laminate.

16. The method of claim 14, wherein the void region comprises a closed gap that extends from the first surface of the stiffener ring to the surface of the laminate, wherein the gap comprises an inner end and an outer end, wherein the inner end is bounded by an inner portion of the stiffener adhesive, and wherein the outer end is bounded by an outer portion of the stiffener adhesive.

17. A method for forming an electronic structure, comprising:

solderably coupling a laminate to an electronic carrier;

adhesively attaching a stiffener ring located at a peripheral portion of the laminate to a surface of the laminate by stiffener adhesive having a first surface and a second surface, wherein a portion of the first surface of the stiffener adhesive is in adhesive contact with a portion of the surface of the laminate, wherein a portion of the second surface of the stiffener adhesive is in adhesive contact with a portion of a first surface of the stiffener ring, wherein the peripheral portion is peripheral to an interior portion of the laminate that is adapted to hold at least one active electronic component, and wherein the peripheral portion of the laminate is not adapted to hold any active electronic component; and adhesive attaching a thermal lid to a portion of a second surface of the stiffener ring by a lid adhesive having a first surface and a second surface, wherein a portion of the first surface of the lid adhesive is in adhesive contact with a portion of a second surface of the stiffener ring, wherein a portion of the second surface of the lid adhesive is in adhesive contact with a portion of a surface of the thermal lid, wherein the void region comprises a gap that extend from the surface of the thermal lid to the surface of the laminate, wherein the gap comprises an inner end and an outer end, wherein the inner end is bounded by an inner portion of the stiffener ring, an inner portion of the stiffener adhesive, and the lid adhesive, wherein the outer end is bounded by an outer portion of the stiffener ring and by an outer portion of the stiffener adhesive, and wherein the outer end is not bounded by the lid adhesive.

18. A method for forming an electronic structure, comprising:

solderably coupling a laminate to an electronic carrier;

adhesively attaching a stiffener ring located at a peripheral portion of the laminated to a surface of the laminate by a stiffener adhesive having a first surface and a second surface, wherein a portion of the first surface of the stiffener adhesive is in adhesive contact with a portion of the surface of the laminate, wherein a portion of the second surface of the stiffener adhesive is in adhesive contact with a portion of a first surface of the stiffener ring, wherein the peripheral portion is peripheral to an interior portion of the laminate that is adapted to hold at least one active electronic component, and wherein the peripheral portion of the laminate is not adapted to hold any active electronic component; and adhesively attaching a thermal lid to a portion of a second surface of the stiffener ring by a lid adhesive having a first surface and a second surface, wherein a portion of the first surface ring of the lid adhesive is in adhesive contact with a portion of a second surface of the stiffener ring, wherein a portion of the second surface of the lid adhesive is in adhesive contact with a portion of a surface of the thermal lid, wherein a void region is disposed between the surface of the thermal lid and the surface of the laminate, wherein the void region comprises a gap that extends form the surface of the thermal lid to the surface of the laminate, wherein the gap comprises an inner end ad an outer end, wherein the inner end is bounded by an inner portion of the stiffener ring, an inner portion of the stiffener adhesive, and an inner portion of the lid adhesive, wherein the outer end is not bounded by any of the stiffener ring, the stiffener adhesive and the lid adhesive.

19. A method for forming an electronic structure, comprising:

solderably coupling a laminate to an electronic carrier;

adhesively attaching n stiffener ring located at a peripheral portion of the laminate to a surface of the laminated by a stiffener adhesive having a first surface and a second surface, wherein a portion of the first surface of the stiffener adhesive is in adhesive contact with a portion of the surface of the laminate, wherein a portion of the second surface of the stiffener adhesive is in adhesive contact with a portion of a first surface of the stiffener ring, wherein the peripheral portion is peripheral to an interior portion of the laminate that is adapted to hold at least one active electronic component, and wherein the peripheral portion of the laminated is not adapted to hod ay active electronic component; and adhesively attaching a thermal lid to a portion of a second surface of the stiffener ring by a lid adhesive having a first surface and a second surface, wherein a portion of the first surface of the lid adhesive is in adhesive contact with a portion of a second surface of the stiffener ring, wherein a portion of the second surface of the lid adhesive is in adhesive contact with a portion of a surface of the thermal lid, wherein a void region is disposed between the surface of the thermal lid and the surface of the laminate, wherein the void region comprises a gap that extends form the surface of the thermal lid to the surface of the laminate, wherein the stiffener ring comprises a first portion and a second portion that is thinner than the first portion, wherein the void region is disposed between a surface of the second portion of the stiffener ring and the surface of the laminate.

20. The method of claim 19, wherein the void region comprises a gap that extends from the surface of the second portion of the stiffener ring to the second surface of the stiffener adhesive.

21. The method of claim 20, wherein the gap is an closed gap adhesive.

22. The method of claim 20, wherein the gap is an open gap.

* * * * *